(12) United States Patent
Wang et al.

(10) Patent No.: US 9,321,949 B2
(45) Date of Patent: Apr. 26, 2016

(54) ADHESIVE, THERMALLY CONDUCTIVE, ELECTRICAL INSULATORS

(71) Applicant: Laird Technologies, Inc., Earth City, MO (US)

(72) Inventors: Yousen Wang, Tianjin (CN); Jingqi Zhao, Tianjin (CN)

(73) Assignee: Laird Technologies, Inc., Earth City, MO (US)

( * ) Notice: Subject to any disclaimer, the term of this patent is extended or adjusted under 35 U.S.C. 154(b) by 567 days.

(21) Appl. No.: 13/759,741

(22) Filed: Feb. 5, 2013

(65) Prior Publication Data

US 2013/0148303 A1    Jun. 13, 2013

Related U.S. Application Data

(63) Continuation-in-part of application No. PCT/CN2011/074182, filed on May 17, 2011.

(51) Int. Cl.
| | |
|---|---|
| *C09K 5/08* | (2006.01) |
| *C09K 5/14* | (2006.01) |
| *H05K 7/20* | (2006.01) |
| *C08L 83/04* | (2006.01) |

(52) U.S. Cl.
CPC . *C09K 5/08* (2013.01); *C08L 83/04* (2013.01); *C09K 5/14* (2013.01); *H05K 7/2039* (2013.01)

(58) Field of Classification Search
None
See application file for complete search history.

(56) References Cited

U.S. PATENT DOCUMENTS

| | | | |
|---|---|---|---|
| 4,842,911 A | 6/1989 | Fick | |
| 8,211,545 B2 | 7/2012 | Asaine | |
| 2008/0254247 A1* | 10/2008 | Asaine | C09D 183/04 428/40.9 |

FOREIGN PATENT DOCUMENTS

| | | |
|---|---|---|
| CN | 101225293 | 7/2008 |
| CN | 101284946 | 7/2012 |
| WO | WO 2012/006465 | 2/2012 |

OTHER PUBLICATIONS

International Search Report and Written Opinion for PCT International Application No. PCT/CN2011/074182 (published as WO 2012/016465) dated Aug. 18, 2011; 12 pages. The instant application is a continuation-in-part of PCT International Application No. PCT/CN2011/074182 which claims priority to Chinese application No. CN201010248494.7 filed Aug. 5, 2010 (published as CN102372925 on Mar. 14, 2012).

Chinese office action dated Aug. 31, 2012 and Search Report dated Aug. 24, 2012 (12 pages) from Chinese application No. 201010248494.7 filed Aug. 5, 2010 (published as CN102372925 on Mar. 14, 2012), 12 pages. The instant application is a continuation-in-part of PCT International Application No. PCT/CN2011/074182 which claims priority to Chinese application No. CN201010248494.7 filed Aug. 5, 2010 (published as CN102372925 on Mar. 14, 2012).

* cited by examiner

*Primary Examiner* — Sheeba Ahmed
(74) *Attorney, Agent, or Firm* — Harness, Dickey & Pierce, P.L.C.

(57) ABSTRACT

According to various aspects, exemplary embodiments are disclosed of adhesive, thermally conductive electrically insulators. In an exemplary embodiment, a thermally conductive, electrically insulating material includes 4 to 40 parts by weight of a macromolecular matrix material; 1 to 20 parts by weight of an adhesive additive; and 40 to 85 parts by weight of thermally conductive electrically insulating particles. The adhesive additive includes a reactive group that is the same as or similar to at least one curable active group in the macromolecular matrix material.

19 Claims, No Drawings

ADHESIVE, THERMALLY CONDUCTIVE, ELECTRICAL INSULATORS

CROSS-REFERENCE TO RELATED APPLICATIONS

This application is a continuation-in-part of PCT International Application No. PCT/CN2011/074182, filed May 17, 2011 (published on Feb. 9, 2012 as WO 2012/016465) which, in turn, claims priority to China Patent Application No. 201010248494.7 filed Aug. 5, 2010 (published on Mar. 14, 2010 as CN102372925). The entire disclosures of the above applications are incorporated herein by reference.

FIELD

The present disclosure generally relates to adhesive, thermally conductive electrical insulators.

BACKGROUND

This section provides background information related to the present disclosure which is not necessarily prior art.

The integration degree of semiconductor devices are increasing as the integration process thereof is rapidly developing. Designers have put effort into assembling more semiconductor devices in a smaller area, so that miniaturization of the apparatus is realized. To ensure a stable operation of these highly integrated semiconductor devices, the heat produced by each of the devices must be transferred to the ambient environment effectively and promptly.

A common process is installing a heat sink made from metals with high thermal conductivity, such as copper or aluminum, on the surface of the electronic components integrated with the semiconductor devices to increase the cooling area. But the surfaces of the electronic components and the heat sinks are not absolutely even. Thus, air gaps inevitably emerge when the uneven surfaces come into contact, which air gaps may result in a significant decrease in cooling effectiveness. Therefore, thermally conductive materials are used to fill the air gaps between the heat sink and the electronic components in order to allow a better thermally conductive pathway between the surfaces as well as a better cooling effect.

Thermally conductive silicone greases and phase change or transition materials have good thermal conductivity but poor electrically insulating properties, and thus are not suitable in those situations where high electrical insulation is needed. A flexible gap filling material with thermal conductivity exhibits certain electrical insulation, but cannot be used in those situations where high electrical insulation is needed. Such a material is only suitable for applications with low pressure, whereas it is not qualified in the fields like high power supplies and automobiles.

A thermally conductive, electrically insulating material having both good thermal conductivity and electrical insulating properties would be capable of solving the problem of achieving good thermal conductivity with high electrical insulating properties. A thermally conductive, electrically insulating material can effectively link a device with a heat sink and provide a thermally conductive channel to reduce thermal resistance and provide good electrically insulating properties to ensure normal operation of the device.

One traditional thermally conductive electrically insulating material is a fully-cured silicon resin composite. This example generally uses a silicon resin as the matrix, and ceramic materials (e.g., aluminum oxide, aluminum nitride or zinc oxide, etc.) as fillers. Because the fully-cured silicon resin lacks adhesion on its surfaces when applied, it may easily slip or shift during the process when the electrically insulating material is mounted onto a heat sink or device in particular during operation on a vertical plane.

To impart adhesion to the material surface, one common method that is frequently employed is to attach a double-sided adhesive tape onto the surface of the thermally conductive electrically insulating material. The tape provides the thermally conductive electrically insulating material with certain adhesion on its surfaces. But this method has a number of disadvantages. For example, the thermally conductive electrically insulating material has such a low surface energy such that the tape cannot adhere directly on the surface. Thus, it is necessary to use expensive silica gel tapes or additionally treat the thermally conductive electrically insulating material by corona and the like to increase the surface energy of the material so that an adhesive tape may be applied subsequently on the surface. The use of silica gel tape will undoubtedly increase the cost, while the corona process tends to deteriorate properties of the material, particularly insulation. The double-sided adhesive tape has a low thermal conductivity, such that the tape decreases the overall thermally conductive effect of the thermally conductive electrically insulating material. Also, it is difficult to use or laminate adhesive tape on both sides of the thermally conductive electrically insulating material. Therefore, the range of use is limited for such a thermally conductive electrically insulating material with double-sided adhesive tape.

SUMMARY

This section provides a general summary of the disclosure, and is not a comprehensive disclosure of its full scope or all of its features.

According to various aspects, exemplary embodiments are disclosed of adhesive, thermally conductive electrically insulators. In an exemplary embodiment, a thermally conductive, electrically insulating material includes 4 to 40 parts by weight of a macromolecular matrix material; 1 to 20 parts by weight of an adhesive additive; and 40 to 85 parts by weight of thermally conductive electrically insulating particles. The adhesive additive includes a reactive group that is the same as or similar to at least one curable active group in the macromolecular matrix material.

Further areas of applicability will become apparent from the description provided herein. The description and specific examples in this summary are intended for purposes of illustration only and are not intended to limit the scope of the present disclosure.

DETAILED DESCRIPTION

According to various aspects, exemplary embodiments are disclosed of adhesive, thermally conductive electrically insulators. In an exemplary embodiment, a thermally conductive electrically insulating material consists essentially or mainly consists of 4 to 40 parts by weight of a macromolecular matrix material; 1 to 20 parts by weight of an adhesive additive; and 40 to 85 parts by weight of thermally conductive electrically insulating particles. The adhesive additive contains a reactive group that is the same as or similar to at least one curable active group in the macromolecular matrix material.

According to another aspect, exemplary embodiments are disclosed of thermally conductive electrically insulating sheets. In an exemplary embodiment, a thermally conductive electrically insulating sheet comprises a support film and a thermally conductive electrically insulating material coated on the support film. The thermally conductive electrically insulating material mainly consists of 4 to 40 parts by weight of a macromolecular matrix material; 1 to 20 parts by weight of an adhesive additive; and 40 to 85 parts by weight of thermally conductive electrically insulating particles. The adhesive additive contains a reactive group that is the same as or similar to at least one curable active group in the macromolecular matrix material.

According to a further aspect, exemplary embodiments are disclosed of processes of preparing thermally conductive electrically insulating materials. In an exemplary embodiment, a method comprises uniformly mixing an uncured macromolecular matrix material with an adhesive additive and uniformly adding thermally conductive electrically insulating particles to the mixed macromolecular matrix material and adhesive additives. The resulting mixture has 4 to 40 parts by weight of the uncured macromolecular matrix material, 1 to 20 parts by weight of the adhesive additive, and 40 to 85 parts by weight of the thermally conductive electrically insulating particles. The adhesive additive contains a reactive group that is the same as or similar to at least one curable active group in the macromolecular matrix material. The method also includes curing and shaping the mixture of the macromolecular matrix material and the adhesive additive added with the thermally conductive electrically insulating particles.

According to an additional aspect, exemplary embodiments are disclosed of processes of preparing thermally conductive electrically insulating sheets. In an exemplary embodiment, a method comprises uniformly mixing an uncured macromolecular matrix material with an adhesive additive and uniformly adding thermally conductive electrically insulating particles to the mixed macromolecular matrix material and adhesive additive. The resulting mixture has 4 to 40 parts by weight of the uncured macromolecular matrix material, 1 to 20 parts by weight of the adhesive additive, and 40 to 85 parts by weight of the thermally conductive electrically insulating particles. The adhesive additive contains a reactive group that is the same as or similar to at least one curable active group in the macromolecular matrix material. The method also includes coating a support film with the mixture of the macromolecular matrix material and the adhesive additive added with the thermally conductive electrically insulating particles. The method further includes curing and shaping the mixture coated on the support film.

The macromolecular matrix material is a material suitable for use between an electronic component and a heat sink. Preferably, the macromolecular matrix material may be one or more selected from vinyl silicon resin, polyisobutylene polymer, organic silicon rubber, polyurethane, methyl methacrylate, organopolysiloxane, acrylate and polyamide resin. The adhesive additive may be one or more selected from MQ silicon resin, petroleum-based rosin resin, silicone resin, polyol, ethyl acrylate, rosin and ethylene phenyl acetate resin. The thermally conductive electrically insulating particles may be one or more selected from aluminum oxide, boron nitride, aluminum nitride, magnesium oxide and zinc oxide. Preferably, the support film is selected from glass fiber cloth, Polyethylene naphthalate (PEN) and polyimide (PI).

The thermally conductive electrically insulating materials in the disclosed exemplary embodiments have good thermal conductivity and electrical insulating properties as well as adhesiveness. Thus, a thermally conductive electrically insulating material disclosed herein may be adhered between a heat sink and an electronic component without having to use double-sided tapes.

In exemplary embodiments of the thermally conductive electrically insulating materials, additional processes such as corona treatment are not introduced so as to allow the use of tapes. Thus, the deterioration of the electrically insulating property of the material is avoided. And, the problem of the overall thermally conductivity of the product being decreased by the low thermal conductivity of adhesive tapes is circumvented. There are no additional processes in the whole manufacturing procedure, which simplifies and reduces costs of the preparation process as compared with prior designs. With exemplary embodiments of the thermally conductive electrically insulating materials of the present disclosure, better surface contact between a heat sink and a device may be achieved and a better thermal conductive effect is provided while electrical insulation is assured.

The thermally conductive electrically insulating materials in the exemplary embodiments of the present disclosure consist essentially or mainly of a macromolecular matrix material, an additive for providing adhesion (sometimes referred to as adhesive additive), and thermally conductive electrically insulating particles. The thermally conductive electrically insulating materials are formed in the present disclosure mainly by mixing the macromolecular matrix materials and the rigid adhesive additives and then filling the thermally conductive electrically insulating particles therein. In this case, the adhesive additives may have active groups for providing adhesion such as hydroxyl functional group or other functional groups capable of providing adhesion. The adhesive additives may also have reactive groups that are the same as or similar to at least one curable active group in the macromolecular matrix materials, such as vinyl group, so as to allow for curing and cross-linking with the matrix materials.

In the exemplary embodiments of the present disclosure, the elastic macromolecular matrix materials can be materials such as high-molecular resins or other high-molecular polymers. The adhesive additives can be either low-molecular polymers such as, but not limited to, low-molecular resins or other low-molecular materials.

In some exemplary embodiments, the thermally conductive electrical insulator includes only three functional components, specifically a macromolecular matrix material, an additive for providing adhesion, and thermally conductive electrically insulating particles. In these exemplary embodiments, the thermally conductive electrical insulator includes only these three functional components. But in other exemplary embodiments, the thermally conductive electrical insulator includes these three functional components and may also include other non-functional or minor components.

In an exemplary embodiment, both sides of the thermally conductive electrical insulator have adhesive properties. When the thermally conductive electrical insulator is placed on an apparatus surface, the thermally conductive electrical insulator will not split even though in a vertical interface. This allows the thermally conductive electrical insulator to be more easily fixed and mounted on an apparatus.

In an exemplary embodiment, a thermally conductive electrically insulator comprises at least three layers and includes a pair of outer layers disposed on opposite sides of a center layer. The center layer may be a film like PEN (polyethylene naphthalate) PI (polyimide), or porous carrier like Fiber Glass. The outer layers consist essentially of silicon resin which is filled with a quantity of thermal conductive particles.

The thermally conductive electrically insulator has high thermal and dielectric performance. Moreover, the thermal resistance may be lower because adhesive surfaces can provide better interface contact.

Hereinafter, aspects of the present disclosure will be illustrated by the following examples. These examples, however, are for purpose illustration only.

Example 1

In a first example of a thermally conductive electrically insulating material, the macromolecular matrix material is vinyl silicon resin. The adhesive additive is vinyl MQ silicon resin.

In a particular exemplary embodiment, the thermally conductive electrically insulating material comprises 4 parts by weight of a vinyl silicon resin, 1 part by weight of a vinyl MQ silicon resin, and 40 parts by weight of aluminum oxide particles having different grain sizes.

In another particular exemplary embodiment, the thermally conductive electrically insulating material comprises 20 parts by weight of a vinyl silicon resin, 10 parts by weight of a vinyl MQ silicon resin, and 70 parts by weight of aluminum oxide particles having different grain sizes.

In still another particular exemplary embodiment, the thermally conductive electrically insulating material comprises 40 parts by weight of a vinyl silicon resin, 20 parts by weight of a vinyl MQ silicon resin, and 85 parts by weight of aluminum oxide particles having different grain sizes.

The parts by weight of each component as specified above are merely illustrative, as the present disclosure is not limited to these values of parts by weight of said components. Preferably, the thermally conductive electrically insulating material of this example includes 4 to 40 parts by weight of a vinyl silicon resin, 1 to 20 parts by weight of a vinyl MQ silicon resin, and 40 to 85 parts by weight of thermally conductive electrically insulating particles. But the present disclosure is not limited to these preferred cases either, while variation in the content of each component can be reasonably made according to practical demands and by limited experiments.

In the above components, the vinyl MQ silicon resin has a hydroxyl functional group. The vinyl MQ silicon resin also has a reactive group that is the same as the curable active group in the vinyl silicon resin, that is, an unsaturated double bond.

The thermally conductive electrically insulating particles can be one or more particles of metal oxide and/or metal nitride, such as one or more selected from aluminum oxide, boron nitride, aluminum nitride, magnesium oxide, and zinc oxide. The thermally conductive electrically insulating particles can have a grain size, for example, selected from 1 micron to 30 microns, but not limited thereto. When choosing the thermally conductive electrically insulating particles, one or more thermally conductive electrically insulating particles having a uniform grain size can be selected, or a combination of one or more metal oxide and/or metal nitride particles having different grain sizes can be selected. For example, a combination of aluminum oxide particles in a range of 10 to 30 microns and boron nitride particles in a range of 1 to 10 microns can be selected. The exemplified numbers here are merely preferred examples, as the thermally conductive electrically insulating particles having a grain size in a broader or narrower range can be selected according to practical demands.

Upon uniform mixing of the uncured macromolecular vinyl silicon resin with vinyl MQ silicon resin, the thermally conductive electrically insulating particles are dispersed uniformly therein. The mixed materials are then cured whereby a thermally conductive electrically insulating material having a good thermal conductivity and electrically insulating property as well as adhesion can be formed. The material can be well adhered between an electronic component and a heat sink without the aid of double-sided tapes or a corona treatment.

It has been demonstrated by a number of experimental tests in the electronic components that the thermally conductive electrically insulating materials as described above in the present example have a good thermal conductivity and insulating property as well as adhesion (also referred to as pressure-sensitive adhesion, that is, adhesion sensitive to pressure), and thus it can be adhered between a heat sink and an electronic component without the use of double-sided tapes. Therefore, the problem of the overall thermally conductive capability of the product being affected by the low thermal conductivity coefficient of adhesive tapes is circumvented.

Table 1 below lists the three thermally conductive electrically insulating materials in this example of the present disclosure as compared with three thermally conductive electrically insulating products in the prior art in terms of thermal conductivity and insulating property as well as adhesion. In table 1, the "conventional sample" is a common thermally conductive electrically insulating material product currently commercially available which provides no adhesion. The "conventional sample providing single-sided adhesion" is a thermally conductive electrically insulating material product formed from a sample of the same conventional sample after a double-sided tape is adhered on one side thereof to provide single-sided adhesion (for a sample with double-sided tapes adhered on both sides, the thermal resistance thereof is much higher than that of the conventional sample provided with single-sided adhesion). The inventive samples 1, 2, and 3 are respectively thermally conductive electrically insulating materials of the present disclosure added with different parts by weight of vinyl MQ silicon resins. In the inventive samples 1, 2, and 3, the content of the vinyl silicon resin as the matrix material is 20 parts by weight, the contents of the vinyl MQ silicon resin are 2, 4, and 6 parts by weight respectively, and the content of the thermally conductive electrically insulating particles (aluminum oxide) is 80 parts. That is, the ratios of MQ silicon resin with respect to vinyl silicon resin are 5 wt % (weight percent), 10 wt % and 15 wt % in the inventive samples 1, 2, and 3, respectively. Moreover, the "home-made conventional sample" is a sample made using a vinyl silicon resin of the same parts by weight as that in the inventive samples 1, 2, and 3 and thermally conductive electrically insulating particles (aluminum oxide) of the same parts by weight. That is, the "home-made conventional sample" has the same composition as that of the inventive samples 1, 2, and 3 except that the vinyl MQ silicon resin is not included. In addition, the dielectric breakdown voltages of the inventive samples 1, 2, and 3 are respectively the average breakdown voltages from 5 spots on each of the samples.

TABLE 1

|  | Thermal resistance (Rth) | Dielectric breakdown voltage in kilovolts (KV) | Peel off value in grams per inch width (g/inch) |
| --- | --- | --- | --- |
| Conventional sample | ~0.55 | >6 KV | 0 |
| Conventional sample providing single-sided adhesion | 0.608 | >6 KV | 22.6 |
| Home-made conventional sample | 0.653 | >6 KV | 0 |
| Inventive sample 1 (5 wt %) | 0.628 | Average 7.9 KV | 5.6~9.1 |
| Inventive sample 2 (10 wt %) | 0.536 | Average 7 KV | 17.6 |
| Inventive sample 3 (15 wt %) | 0.512 | Average 7.5 KV | 23.4 |

As seen in table 1 above, in the inventive samples 1, 2, and 3 added with MQ silicon resin in this example, only sample 1 has a slightly higher thermal resistance while samples 2 and 3 have a lower thermal resistance, which is even lower than that of the "conventional sample", as compared with the "conventional sample providing single-sided adhesion". As compared with the "home-made conventional sample" without addition of MQ silicon resin, the inventive samples 1, 2, and 3 added with MQ silicon resin in this example all have a lower thermal resistance and a higher dielectric breakdown voltage, and are further provided with adhesion. That is, after the addition of MQ silicon resin, the thermal conductivity and insulating property are enhanced and adhesion is provided. Thus, the thermally conductive electrically insulating material added with MQ silicon resin in this example of the present disclosure can be disposed between a heat sink and an electronic component as a thermally conductive electrically insulating material of the electronic component. Also, since the material possesses adhesion itself, it can be mounted between a heat sink and an electronic component without the use of double-sided tapes. Moreover, by adjusting the proportion by weight of the polymer (MQ silicon resin) as the adhesive additive, excellent thermal conductive and insulating effect (even superior to current thermally conductive electrically insulating material products without double-sided tapes) as well as excellent adhesive effect (even superior to double-sided tapes) can be obtained.

In this example of the present disclosure, by adding the polymer (MQ silicon resin) having an active group (e.g., hydroxyl group) for providing adhesion and a group (an unsaturated double bond) capable of reacting with a vinyl silicon resin into an uncured elastic macromolecular matrix resin (vinyl silicon resin), this low-molecular polymer can be subjected to a cross-linking reaction together with the matrix resin so as to complete the cross-linked network upon a curing and shaping of the matrix resin. The cured material can have certain adhesion due to the addition of the low-molecular polymer, and the adhesion is adjustable according to the ratio of the low-molecular polymer added. In this example, because the low-molecular polymer having adhesiveness is added in situ, the manufacturing procedure is not affected or imposed with any additional steps, while the final product's thermally conductivity and electrical insulating properties are not adversely affected. Here, the term "in situ" means that the addition is completed during the preparation process, without additional materials or processes introduced after the final product is prepared.

Hereinafter, the process of preparing the thermally conductive electrically insulating material according to the present example will be described in details. The process comprises (1) uniformly mixing an uncured macromolecular matrix material and a low-molecular adhesive additive. In this example, the macromolecular matrix material is 4 to 40 parts by weight of vinyl silicon resin. The low-molecular adhesive additive is 1 to 20 parts by weight of vinyl MQ silicon resin. Here, the content of 4 to 40 parts by weight and 1 to 20 parts by weight are merely preferred cases, and variation can be reasonably made according to practical demands.

For example, the vinyl MQ silicon resin can be uniformly dispersed into the uncured vinyl silicon resin. Specifically, the mixing can be carried out uniformly by using a blender such as a dual planetary blender in a vacuum mixing manner. The above two resins (vinyl silicon resin and vinyl MQ silicon resin) can also be respectively dispersed into a solvent such as naphtha (or other solvents for silicon resin such as toluene or n-heptane), then mixed uniformly by a stirring apparatus such as a dual planetary blender.

This example process also includes (2) mixing the thermally conductive electrically insulating particles uniformly into the dispersed resin mixture above. For example, 40 to 85 parts by weight of one or more of aluminum oxide, boron nitride, aluminum nitride, magnesium oxide, and zinc oxide that satisfy a predetermined requirement for grain size are mixed uniformly by stirring equipment, so that the particles are fully dispersed into the above dispersed resin mixture. As an example, aluminum oxide particles are dispersed uniformly into the above dispersed resin mixture.

This example process further includes (3) curing and shaping the mixed materials. For example, the mixed materials of vinyl silicon resin, vinyl MQ vinyl silicon resin, and thermally conductive electrically insulating particles can be cured and shaped at a temperature of 100° C. to 180° C. The curing is completed after several minutes (e.g., 1 to 10 minutes, etc.).

Thermally conductive electrically insulating materials having a pressure-sensitive adhesion are formed through the processes described above.

For convenient use of the product and to increase tear resistance thereof, a supporting carrier (or film sheet) can be added into the thermally conductive electrically insulating material having the above composition to form a thermally conductive electrically insulating sheet. The supporting carrier can be, for example, a glass fiber cloth or a film of insulating polymers such as PEN (polyethylene naphthalate) and PI (polyimide), but not limited thereto.

By way of example, a process of preparing a thermally conductive electrically insulating sheet includes (A) uniformly mixing an uncured matrix material and a low-molecular adhesive additive. This step (A) can be the same as the step (1) as described above.

The process also includes (B) mixing thermally conductive electrically insulating particles uniformly into the above dispersed resin mixture. This step (B) can be the same as the step (2) as described above.

The process further includes (C) coating the materials mixed in the above step (B) onto both sides of a carrier. The carrier can be selected from glass fiber cloth, or a film of insulating polymer such as PEN (polyethylene naphthalate) or PI (polyimide) but not limited thereto, and can also be other films with or without pores that can function as a support.

The thickness of the film can be selected according to the ultimate requirement for the thermal conductivity and electrical insulating property of the product and/or for thickness of the product. Generally, the thickness can be selected in a range of 12 to 100 microns but not limited thereto. Different thickness can be selected with respect to different carrier materials. As an example, a PEN (polyethylene naphthalate) polymer having a film thickness of 0.0254 mm can be selected or used in an exemplary embodiment.

The materials mixed in the above step (B) can be adjusted by using a solvent so that the viscosity of the solution can reach a level required by a coating process. The mixed solution can be then coated onto the PEN (polyethylene naphthalate) polymer film as the carrier.

The process additionally includes (D) curing the mixed materials coated on the polymer film.

The thermally conductive electrically insulating sheet with larger tensile strength and having pressure-sensitive adhesion can be formed, for example, upon curing at a temperature of 100° C. to 180° C. for a certain period such as 1 to 10 minutes (but not limited thereto). The formed thermally conductive electrically insulating sheet can be rolled or sliced for easy use.

In this example, the vinyl silicon resin can be replaced by one or more of organopolysiloxane, acrylate, and polyamide resin. The vinyl MQ silicon resin as the adhesive additive can be replaced by rosin, ethylene phenyl acetate resin, or other MQ silicon resin or the like with the provision that at least one of the adhesive additives has a group providing adhesion and a reactive group that is the same as or similar to at least one curable active group in the matrix material. In an example, the curable active reactive group of organopolysiloxane is siloxane, the curable active reactive group of acrylate is an unsaturated double bond, and the curable active reactive group of polyamide is amido, while the group providing adhesion for rosin or ethylene phenyl acetate resin is hydroxyl, and the group thereof subjected to a curing and cross-linking reaction with the matrix material is a Si—H bond or a C=C double bond. Therefore, after the materials are replaced, thermally conductive electrically insulating materials and sheets with good thermal conductivity and electrical insulating properties as well as adhesion can be produced similarly.

It has been proved by experimental tests in electronic components that the thermally conductive electrically insulating sheet with the composition described above has good thermal conductivity and electrical insulating properties, and is provided with adhesion on both sides of the sheet. Therefore, a better surface contact between a heat sink and a device is achieved and a better thermal conductive effect is provided while electrical insulation is assured.

In addition, there are no additional processes in the whole manufacturing procedure, and thereby the preparation process is greatly simplified and the cost is significantly reduced as compared with the prior designs. The pressure-sensitive adhesion of the thermally conductive electrically insulating material made in this example can be adjusted by adjusting the addition ratio of the vinyl MQ silicon resin.

Example 2

In this second example, the macromolecular matrix material is a polyisobutylene polymer of 4 to 40 parts by weight. The low-molecular adhesive additive is a petroleum-based rosin resin of 1 to 20 parts by weight. Here, the exemplified contents of 4 to 40 parts by weight and 1 to 20 parts by weight are merely preferred cases, and variations thereof can be reasonably made according to practical demands.

The thermally conductive electrically insulating particles can be one or more selected from aluminum oxide, boron nitride, aluminum nitride, magnesium oxide and zinc oxide, and the used amount thereof is for example 40 to 85 parts by weight. Here, the content of 40 to 85 parts by weight is merely a preferred example, and variations thereof can be reasonably made according to practical demands.

In a particular exemplary embodiment, the thermally conductive electrically insulating material comprises 4 parts by weight of a polyisobutylene polymer, 1 part by weight of a petroleum-based rosin resin, and 60 parts by weight of particles of boron nitride and zinc oxide.

In another particular exemplary embodiment, the thermally conductive electrically insulating material comprises 20 parts by weight of a polyisobutylene polymer, 10 parts by weight of a petroleum-based rosin resin, and 70 parts by weight of particles of boron nitride and zinc oxide.

In still another particular exemplary embodiment, the thermally conductive electrically insulating material comprises 40 parts by weight of a polyisobutylene polymer, 20 parts by weight of a petroleum-based rosin resin, and 80 parts by weight of particles of boron nitride and zinc oxide.

The uncured polyisobutylene polymer, petroleum-based rosin resin, and thermally conductive electrically insulating particles are thoroughly and uniformly mixed, then cured and shaped to form the thermally conductive electrically insulating material having a good thermal conductivity and insulating property as well as adhesion.

Similarly, a supporting carrier, such as a glass fiber cloth or a film of insulating polymers such as PEN (polyethylene naphthalate) and PI (polyimide), can be added into the mixture of polyisobutylene polymer, petroleum-based rosin resin, and thermally conductive electrically insulating particles, after they are thoroughly mixed, to form a thermally conductive electrically insulating sheet.

An exemplary embodiment of a process of preparing the above-mentioned thermally conductive electrically insulating material or sheet includes (1) uniformly mixing an uncured polyisobutylene polymer and a petroleum-based rosin resin. In this step, the amount of the polyisobutylene polymer is, for example, 4 to 40 parts by weight, and the amount of the petroleum-based rosin resin is, for example, 1 to 20 parts by weight.

The polyisobutylene polymer and the petroleum-based rosin resin can be uniformly mixed by a stirring apparatus. Or the two resins can be respectively dispersed in a solvent such as naphtha, and then uniformly mixed by a stirring apparatus.

The process also includes (2) mixing the thermally conductive electrically insulating particles uniformly into the mixture of the polyisobutylene polymer and the petroleum-based rosin resin.

The process further includes (3) curing and shaping the material mixed in step (2) directly if addition of a supporting carrier is not desired.

The curing and shaping is carried out, for example, at a temperature of 100° C. to 180° C. (but not limited thereto) for a certain period such as 1 to 10 minutes or longer. A thermally conductive electrically insulating material having pressure-sensitive adhesion is formed upon curing.

If a supporting carrier is added, the material mixed in step (2) is firstly coated onto both sides of the supporting carrier such as glass fiber cloth, PEN (polyethylene naphthalate) and PI (polyimide) in this step. Then, the mixture coated on the polymer film is subjected to curing. The thermally conductive electrically insulating sheet added with a supporting carrier has better tear resistance.

It has been proved by experimental tests in electronic components that the thermally conductive electrically insulating material and sheet as described above in this example has good thermal conductivity and electrical insulating properties, and the material is provided with adhesion (pressure-sensitive adhesion, that is, adhesion sensitive to pressure) on surfaces thereof and can thus be adhered between a heat sink and a device without the use of double-sided tapes. In addition, the pressure-sensitive performance of the thermally conductive electrically insulating material prepared in this example can be adjusted by controlling the ratio of petroleum-based rosin resin added so as to adapt to the demand of different application situations. Better surface contact between a heat sink and a device is achieved by providing adhesion on the surface of the material, and a better thermally conductive effect is provided while electrical insulation is assured. Moreover, the process employed in this example in which the petroleum-based rosin resin is added in situ brings about no adverse impact to the matrix materials in terms of electrical insulating properties, and neither additional adhesive tapes or agents nor additional processes are needed.

In this example, the petroleum-based rosin resin has a group providing adhesion, such as a carboxyl group or a hydroxyl group. The petroleum-based rosin resin also has a cure-active reactive group (unsaturated double bond) the same as that of a polyisobutylene polymer. Thus, cross-linking and curing can be accomplished together with polyisobutylene polymers.

Example 3

In this third example, the macromolecular matrix material is an organic silicon rubber of 4 to 40 parts by weight. The low-molecular adhesive additive is a silicone resin of 1 to 20 parts by weight. Here, the exemplified contents of 4 to 40 parts by weight and 1 to 20 parts by weight are merely preferred examples, and variations thereof can be reasonably made according to practical demands.

The thermally conductive electrically insulating particles can be one or more selected from aluminum oxide, boron nitride, aluminum nitride, magnesium oxide, and zinc oxide. And, the used amount thereof is for example 40 to 85 parts by weight. Here, the content of 40 to 85 parts by weight is merely a preferred example, and variations thereof can be reasonably made according to practical demands.

In a particular exemplary embodiment, the thermally conductive electrically insulating material comprises 4 parts by weight of an organic silicon rubber, 1 part by weight of a silicone resin, and 40 parts by weight of boron nitride particles.

In another particular exemplary embodiment, the thermally conductive electrically insulating material comprises 20 parts by weight of an organic silicon rubber, 10 parts by weight of a silicone resin, and 70 parts by weight of boron nitride particles.

In still another particular exemplary embodiment, the thermally conductive electrically insulating material comprises 40 parts by weight of an organic silicon rubber, 20 parts by weight of a silicone resin, and 85 parts by weight of boron nitride particles.

The above organic silicon rubber, silicone resin, and thermally conductive electrically insulating particles are thoroughly and uniformly mixed, then cured and shaped to form the thermally conductive electrically insulating material having a good thermal conductivity and electrical insulating properties as well as adhesion.

Similarly, a supporting carrier, such as a glass fiber cloth or a film of insulating polymers such as PEN (polyethylene naphthalate) and PI (polyimide), can be added into the mixture of organic silicon rubber, silicone resin, and thermally conductive electrically insulating particles, after they are thoroughly mixed, to form a thermally conductive electrically insulating sheet.

An exemplary embodiment of a process of preparing the above-mentioned thermally conductive electrically insulating material or sheet includes (1) uniformly mixing an uncured organic silicon rubber and a silicone resin. The amount of the organic silicon rubber is, for example, 4 to 40 parts by weight. The amount of the silicone resin is, for example, 1 to 20 parts by weight. The organic silicon rubber and the silicone resin can be uniformly mixed by a stirring apparatus. Or, the two resins can be respectively dispersed in a solvent such as naphtha, and then uniformly mixed by a stirring apparatus.

The process also includes (2) mixing the thermally conductive electrically insulating particles uniformly into the mixture of the organic silicon rubber and the silicone resin.

The process further includes (3) curing and shaping the material mixed in step (2) directly if addition of a supporting carrier is not desired. The curing and shaping is carried out, for example, at a temperature of 100° C. to 180° C. (but not limited thereto) for a certain period such as 1 to 10 minutes or longer. A thermally conductive electrically insulating material having pressure-sensitive adhesion is formed upon curing.

If a supporting carrier is added, the material mixed in step (2) is firstly coated onto both sides of the supporting carrier such as glass fiber cloth, PEN (polyethylene naphthalate), or PI (polyimide) in this step. Then the mixture coated on the polymer film is subjected to curing. The thermally conductive electrically insulating sheet added with a supporting carrier has better tear resistance.

It has been proved by experimental tests in electronic components that the thermally conductive electrically insulating material and sheet as described above in this example has good thermal conductivity and electrical insulating properties, and the material is provided with adhesion (pressure-sensitive adhesion, that is, adhesion sensitive to pressure) on its surfaces and can thus be adhered between a heat sink and a device without the use of double-sided tapes. In addition, the pressure-sensitive performance of the thermally conductive electrically insulating material prepared in this example can be adjusted by controlling the ratio of silicone resin added so as to adapt to the demand of different application situations. Better surface contact between a heat sink and a device is achieved by providing adhesion on the surface of the material, and a better thermally conductive effect is provided while electrical insulation is assured. Moreover, the process employed in this example in which the silicone resin is added in situ brings about no adverse impact to the matrix materials in terms of electrical insulating properties, and neither additional adhesive tapes or agents nor additional processes are needed. In this example, the silicone resin has a group (hydroxyl group) providing adhesion, and has a cure-active reactive group (unsaturated double bond) the same as that of an organic silicon rubber. Thus, a cross-linking and curing can be accomplished together with organic silicon rubbers.

Example 4

In this fourth example, the macromolecular matrix material is a polyurethane of 4 to 40 parts by weight. The low-molecular adhesive additive is a polyol of 1 to 20 parts by weight. Here, the exemplified contents of 4 to 40 parts by weight and 1 to 20 parts by weight are merely preferred examples, and variation thereof can be reasonably made according to practical demands.

The thermally conductive electrically insulating particles can be one or more selected from aluminum oxide, boron nitride, aluminum nitride, magnesium oxide, and zinc oxide. And, the used amount thereof is for example 40 to 85 parts by weight. Here, the content of 40 to 85 parts by weight is merely a preferred example, and variations thereof can be reasonably made according to practical demands.

In a particular exemplary embodiment, the thermally conductive electrically insulating material comprises 4 parts by weight of polyurethane, 1 part by weight of polyols, and 40 parts by weight of aluminum nitride particles.

In another particular exemplary embodiment, the thermally conductive electrically insulating material comprises 20 parts by weight of polyurethane, 10 parts by weight of polyols, and 60 parts by weight of aluminum nitride particles.

In still another particular exemplary embodiment, the thermally conductive electrically insulating material comprises 40 parts by weight of polyurethane, 20 parts by weight of polyols, and 85 parts by weight of aluminum nitride particles.

The polyurethane, polyols, and thermally conductive electrically insulating particles described above are thoroughly and uniformly mixed, then cured and shaped to form the thermally conductive electrically insulating material having a good thermal conductivity and electrical insulating properties as well as adhesion.

Similarly, a supporting carrier, such as a glass fiber cloth or a film of insulating polymers such as PEN (polyethylene naphthalate) and PI (polyimide), can be added into the mixture of the polyurethane, polyols and the thermally conductive electrically insulating particles, after they are thoroughly mixed, to form a thermally conductive electrically insulating sheet.

An exemplary embodiment of a process of preparing the above-mentioned thermally conductive electrically insulating material or sheet includes (1) uniformly mixing an uncured polyurethane and polyols. The amount of the polyurethane is, for example, of 4 to 40 parts by weight. And, the amount of the polyols is, for example, 1 to 20 parts by weight. The polyurethane and polyols can be uniformly mixed by a stirring apparatus. Or, the two resins can be respectively dispersed in a solvent such as naphtha, and then uniformly mixed by a stirring apparatus.

The process also includes (2) mixing the thermally conductive electrically insulating particles uniformly into the mixture of the polyurethane and polyols. The process further includes (3) curing and shaping the material mixed in step (2) directly if addition of a supporting carrier is not desired.

The curing and shaping is carried out, for example, at a temperature of 100° C. to 180° C. (but not limited thereto) for a certain period such as 1 to 10 minutes or longer. A thermally conductive electrically insulating material having pressure-sensitive adhesion is formed upon curing.

If a supporting carrier is added, the material mixed in step (2) is firstly coated onto both sides of the supporting carrier such as glass fiber cloth, PEN (polyethylene naphthalate) or PI (polyimide) in this step. Then, the mixture coated on the polymer film is subjected to curing. The thermally conductive electrically insulating sheet added with a supporting carrier has better tear resistance.

It has been proved by experimental tests in electronic components that the thermally conductive electrically insulating material and sheet as described above in this example has good thermal conductivity and electrical insulating properties, and the material is provided with adhesion (pressure-sensitive adhesion, that is, adhesion sensitive to pressure) on surfaces thereof and can thus be adhered between a heat sink and a device without the use of double-sided tapes. In addition, the pressure-sensitive performance of the thermally conductive electrically insulating material prepared in this example can be adjusted by controlling the ratio of polyols added so as to adapt to the demand of different application situations. Better surface contact between a heat sink and a device is achieved by providing adhesion on the surface of the material, and a better thermally conductive effect is provided while electrical insulation is assured. Moreover, the process employed in this example in which the polyols are added in situ brings about no adverse impact to the matrix materials in terms of electrical insulating properties, and neither additional adhesive tapes or agents nor additional processes are needed.

In this example, polyols have a group (hydroxyl group) providing adhesion, which group can be subjected to an esterification reaction with polyurethane to form cross-links, so that the cross-linking and curing can be accomplished together with polyurethane.

Example 5

In this fifth example, the macromolecular matrix material is methyl methacrylate of 4 to 40 parts by weight. The low-molecular adhesive additive is ethyl acrylate of 1 to 20 parts by weight. Here, the exemplified contents of 4 to 40 parts by weight and 1 to 20 parts by weight are merely preferred examples, and variations thereof can be reasonably made according to practical demands.

The thermally conductive electrically insulating particles can be one or more selected from aluminum oxide, boron nitride, aluminum nitride, magnesium oxide, and zinc oxide. And, the used amount thereof is for example 40 to 85 parts by weight. Here, the content of 40 to 85 parts by weight is merely a preferred example, and variations thereof can be reasonably made according to practical demands.

In a particular exemplary embodiment, the thermally conductive electrically insulating material comprises 4 parts by weight of methyl methacrylate, 1 part by weight of ethyl acrylate, and 40 parts by weight of particles of magnesium oxide and zinc oxide.

In another particular exemplary embodiment, the thermally conductive electrically insulating material comprises 20 parts by weight of methyl methacrylate, 10 parts by weight of ethyl acrylate, and 60 parts by weight of particles of magnesium oxide and zinc oxide.

In still another particular exemplary embodiment, the thermally conductive electrically insulating material comprises 40 parts by weight of methyl methacrylate, 20 parts by weight of ethyl acrylate, and 85 parts by weight of particles of magnesium oxide and zinc oxide.

The methyl methacrylate, ethyl acrylate, and thermally conductive electrically insulating particles described above are thoroughly and uniformly mixed, then cured and shaped to form the thermally conductive electrically insulating material having a good thermal conductivity and electrical insulating properties as well as adhesion.

Similarly, a supporting carrier, such as a glass fiber cloth or a film of insulating polymers such as PEN (polyethylene naphthalate) and PI (polyimide), can be added into the mixture of the methyl methacrylate, ethyl acrylate, and thermally conductive electrically insulating particles, after they are thoroughly mixed, to form a thermally conductive electrically insulating sheet.

An exemplary embodiment of a process of preparing the above-mentioned thermally conductive electrically insulating material or sheet includes (1) uniformly mixing uncured methyl methacrylate and ethyl acrylate. The amount of the methyl methacrylate is, for example, of 4 to 40 parts by weight. And, the amount of the ethyl acrylate is, for example, 1 to 20 parts by weight. The methyl methacrylate and ethyl acrylate can be uniformly mixed by a stirring apparatus. Or, the two resins can be respectively dispersed in a solvent such as naphtha, and then uniformly mixed by a stirring apparatus.

The process also includes (2) mixing the thermally conductive electrically insulating particles uniformly into the mixture of the methyl methacrylate and the ethyl acrylate. The process further includes (3) curing and shaping the material mixed in step (2) directly if addition of a supporting carrier is not desired.

The curing and shaping is carried out, for example, at a temperature of 100° C. to 180° C. (but not limited thereto) for a certain period such as 1 to 10 minutes or longer. A thermally conductive electrically insulating material having pressure-sensitive adhesion is formed upon curing.

If a supporting carrier is added, the material mixed in step (2) is firstly coated onto both sides of the supporting carrier such as glass fiber cloth, PEN or PI in this step, and then the mixture coated on the polymer film is subjected to curing. The thermally conductive electrically insulating sheet added with a supporting carrier has better tear resistance.

It has been proved by experimental tests in electronic components that the thermally conductive electrically insulating material and sheet as described above in this example has good thermal conductivity and electrical insulating properties, and the material is provided with adhesion (pressure-sensitive adhesion, that is, adhesion sensitive to pressure) on surfaces thereof and can thus be adhered between a heat sink and a device without the use of double-sided tapes. In addition, the pressure-sensitive performance of the thermally conductive electrically insulating material prepared in this example can be adjusted by controlling the ratio of ethyl acrylate added so as to adapt to the demand of different application situations. Better surface contact between a heat sink and a device is achieved by providing adhesion on the surface of the material, and a better thermally conductive effect is provided while electrical insulation is assured. Moreover, the process employed in this example in which the ethyl acrylate is added in situ brings about no adverse impact to the matrix materials in terms of electrical insulating property, and neither additional adhesive tapes or agents nor additional processes are needed.

In this example, ethyl acrylate has a group providing adhesion such as a hydroxyl group or a carboxyl group, and has a cure-active reactive group (unsaturated double bond) the same as that of the methyl methacrylate. Thus, cross-linking and curing can be accomplished together with methyl methacrylate.

Example 6

In the thermally conductive electrically insulating material or sheet in each of the above-described examples, only one macromolecular matrix material and one low-molecular adhesive additive are included. But in other exemplary embodiments, a thermally conductive electrically insulating material or sheet may include a plurality of macromolecular matrix materials and/or a plurality of low-molecular adhesive additives.

In this example, the macromolecular matrix material is one or more selected from vinyl silicon resin, polyisobutylene polymer, organic silicon rubber, polyurethane, methyl methacrylate, organopolysiloxane, methyl vinyl silicon resin, acrylate, and polyamide resin. The matrix material has a total content of 4 to 40 parts by weight. Here, the content of 4 to 40 parts by weight is merely a preferred example, and variations thereof can be reasonably made according to practical demands.

The low-molecular adhesive additive is one or more selected from MQ silicon resin, petroleum-based rosin resin, silicone resin, polyols, ethyl acrylate, rosin, and ethylene phenyl acetate resin, provided that at least one of the selected low-molecular adhesive additives has a group providing adhesion and a cure reactive group that is the same as or similar to at least one in the selected matrix materials. The selected low-molecular adhesive additive has a total content of 1 to 20 parts by weight. Here, the content of 1 to 20 parts by weight is merely a preferred example, and variations thereof can be reasonably made according to practical demands.

As an example for the matrix materials, 15 parts by weight each of vinyl silicon resin, polyisobutylene polymer, and organic silicon rubber can be used with a total of 45 parts by weight. For the adhesive additives, 3 parts by weight each of a MQ silicon resin and a petroleum-based rosin resin may be used.

The thermally conductive electrically insulating particles can be one or more particles of metal oxides and/or metal nitrides, for example one or more selected from aluminum oxide, boron nitride, aluminum nitride, magnesium oxide, and zinc oxide. And, the used amount thereof is for example 40 to 85 parts by weight. Here, the content of 40 to 85 parts by weight is merely a preferred example, and variations thereof can be reasonably made according to practical demands. As an example, 65 parts by weight, e.g., of boron nitride particles can be selected.

The selected matrix materials, low-molecular adhesive additives, and thermally conductive electrically insulating particles are thoroughly and uniformly mixed, then cured and shaped to form the thermally conductive electrically insulating material having a good thermal conductivity and electrical insulating properties as well as adhesion.

Similarly, a supporting carrier, such as a glass fiber cloth or a film of insulating polymers such as PEN (polyethylene naphthalate) and PI (polyimide), can be added into the mixture of matrix materials, low-molecular adhesive additives and thermally conductive electrically insulating particles, after they are thoroughly mixed, to form a thermally conductive electrically insulating sheet.

An exemplary embodiment of a process of preparing the above-mentioned thermally conductive electrically insulating material or sheet includes (1) uniformly mixing uncured matrix materials and low-molecular adhesive additives. In this case, the matrix is one or more selected from vinyl silicon resin, polyisobutylene polymer, organic silicon rubber, polyurethane, methyl methacrylate, organopolysiloxane, acrylate, and polyamide resin. The matrix materials have a total content of 4 to 40 parts by weight.

The low-molecular adhesive additive is one or more selected from MQ silicon resin, petroleum-based rosin resin, silicone resin, polyols, ethyl acrylate, rosin, and ethylene phenyl acetate resin, provided that at least one of the selected low-molecular adhesive additives has a group providing adhesion and a cure reactive group that is the same as or similar to that in at least one of the selected matrix materials. The selected low-molecular adhesive additives have a total content of 1 to 20 parts by weight.

The selected matrix materials and low-molecular adhesive additives can be uniformly mixed by a stirring apparatus. Or, the selected matrix materials and low-molecular adhesive additives can be respectively dispersed in a solvent such as naphtha, and then uniformly mixed by a stirring apparatus.

The process also includes (2) mixing the thermally conductive electrically insulating particles uniformly into the mixture of the selected matrix materials and low-molecular adhesive additives. The process further includes (3) curing and shaping the material mixed in step (2) directly if addition of a supporting carrier is not desired.

The curing and shaping is carried out, for example, at a temperature of 100° C. to 180° C. (but not limited thereto) for a certain period such as 1 to 10 minutes or longer. A thermally conductive electrically insulating material having pressure-sensitive adhesion is formed upon curing.

If a supporting carrier is added, the material mixed in step (2) is firstly coated onto both sides of the supporting carrier such as glass fiber cloth, PEN (polyethylene naphthalate) or PI (polyimide) in this step. Then, the mixture coated on the polymer film is cured. The thermally conductive electrically insulating sheet added with a supporting carrier has better tear resistance.

It has been proved by experimental tests in electronic components that the thermally conductive electrically insulating material as described above in this example has good thermally conductivity and electrical insulating properties, and the material is provided with adhesion (pressure-sensitive adhesion, that is, adhesion sensitive to pressure) on surfaces thereof and can thus be adhered between a heat sink and a device without the use of double-sided tapes.

In addition, the pressure-sensitive performance of the thermally conductive electrically insulating material prepared in this example can be adjusted by controlling the ratio of adhesive additives added so as to adapt to the demand of different application situations. Better surface contact between a heat sink and a device is achieved by providing adhesion on the surface of the material, and a better thermally conductive effect is provided while electrical insulation is assured. Moreover, the process employed in this example in which the adhesive additives are added in situ brings about no adverse impact to the matrix materials in terms of electrical insulating properties, and neither additional adhesive tapes or agents nor additional processes are needed.

In this example, the adhesive additives have a group providing adhesion and a cure-active reactive group that is the same as that of at least one of the matrix materials. Thus, cross-linking and curing can be accomplished together with the matrix materials and the cured material is imparted with adhesion.

In the above description of the specific examples of the present disclosure, the features described and/or illustrated with respect to one embodiment can be equivalently or similarly applied in one or more of other embodiments, or combine with or substitute the features in other embodiments. The purposes, technical solutions and beneficial effects have been further explained in detail in the above-described specific examples. But it should be understood that the above description is merely an illustration of specific examples of the present invention, and should not in any way limit the protective scope of the present invention. It is intended that any modification, equivalent substitution, improvement or the like made within the spirit and principle of the present invention, falls within the protective scope of the present invention.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally," "about," and "substantially," may be used herein to mean within manufacturing tolerances. Or for example, the term "about" as used herein when modifying a quantity of an ingredient or reactant of the invention or employed refers to variation in the numerical quantity that can happen through typical measuring and handling procedures used, for example, when making concentrates or solutions in the real world through inadvertent error in these procedures; through differences in the manufacture, source, or purity of the ingredients employed to make the compositions or carry out the methods; and the like. The term "about" also encompasses amounts that differ due to different equilibrium conditions for a composition resulting from a particular initial mixture. Whether or not modified by the term "about," the claims include equivalents to the quantities.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper" and the like, may be used herein for ease of description to describe one element or feature's relationship to another element(s) or feature(s) as illustrated in the FIGURES. Spatially relative terms may be intended to encompass different orientations of the device in use or operation in addition to the orientation depicted in the FIGURES. For example, if the device in the FIGURES is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A thermally conductive electrically insulating material consisting only of:
   4 to 40 parts by weight of a macromolecular matrix material;
   1 to 20 parts by weight of an adhesive additive; and
   40 to 85 parts by weight of thermally conductive electrically insulating particles.

2. The thermally conductive electrically insulating material of claim 1, wherein:
   the macromolecular matrix material comprises one or more of vinyl silicon resin, polyisobutylene polymer, organic silicon rubber, polyurethane, methyl methacrylate, organopolysiloxane, acrylate, and polyamide resin; and
   the adhesive additive comprises one or more of MQ silicon resin, petroleum-based rosin resin, silicone resin, polyols, ethyl acrylate, rosin, and ethylene phenyl acetate resin.

3. The thermally conductive electrically insulating material of claim 1, wherein the thermally conductive electrically insulating particles comprise one or more of aluminum oxide, boron nitride, aluminum nitride, magnesium oxide and zinc oxide.

4. The thermally conductive electrically insulating material of claim 1, wherein the adhesive additive includes a reactive group that is the same as at least one curable active group in the macromolecular matrix material.

5. The thermally conductive electrically insulating material of claim 1, wherein:
   the macromolecular matrix material is vinyl silicon resin, the adhesive additive is vinyl MQ silicon resin, the thermally conductive electrically insulating particles are aluminum oxide particles; or
   the macromolecular matrix material is polyisobutylene polymer, the adhesive additive is petroleum-based rosin resin, the thermally conductive electrically insulating particles are boron nitride and zinc oxide particles; or
   the macromolecular matrix material is organic silicon rubber, the adhesive additive is silicon resin, the thermally conductive electrically insulating particles are boron nitride particles; or
   the macromolecular matrix material is polyurethane, the adhesive additive is polyols, the thermally conductive electrically insulating particles are aluminum nitride particles; or
   the macromolecular matrix material is methyl methacrylate, the adhesive additive is ethyl acrylate, the thermally conductive electrically insulating particles are magnesium oxide and zinc oxide particles; or
   the macromolecular matrix material includes vinyl silicon resin, polyisobutylene polymer, and organic silicon rubber, and the adhesive additives include a MQ silicon resin and a petroleum-based rosin resin.

6. The thermally conductive electrically insulating material of claim 1, wherein the thermally conductive electrically insulating material has a thermal resistance of 0.628 or less, a dielectric breakdown voltage of at least 7 kilovolts or more, and at least a peel off value of 5.6 grams per inch width or more.

7. The thermally conductive electrically insulating material of claim 1, wherein both sides of the thermally conductive electrically insulating material have adhesive properties thereby allowing the thermally conductive electrically insulating material to be adhered between a heat sink and an electronic component.

8. An electronic device including a heat sink, an electronic component, and the thermally conductive electrically insulating material of claim 1 adhered between the heat sink and the electronic component without using double-sided adhesive tape.

9. A thermally conductive electrically insulating sheet comprising a support film and the thermally conductive electrically insulating material of claim 1 coated on the support film.

10. The thermally conductive electrically insulating sheet of claim 9, wherein:
the macromolecular matrix material comprises one or more of vinyl silicon resin, polyisobutylene polymer, organic silicon rubber, polyurethane, methyl methacrylate, organopolysiloxane, acrylate and polyamide resin; and
the adhesive additive comprises one or more of MQ silicon resin, petroleum-based rosin resin, silicone resin, polyols, ethyl acrylate, rosin, and ethylene phenyl acetate resin.

11. The thermally conductive electrically insulating sheet of claim 9, wherein the thermally conductive electrically insulating particles comprise one or more of aluminum oxide, boron nitride, aluminum nitride, magnesium oxide, and zinc oxide.

12. The thermally conductive electrically insulating sheet of claim 9, wherein the support film comprises glass fiber cloth, polyethylene naphthalate (PEN) or polyimide (PI).

13. The thermally conductive electrically insulating sheet of claim 9, wherein both sides of the thermally conductive electrically insulating sheet have adhesive properties, whereby the thermally conductive electrically insulating sheet may be adhered between a heat sink and an electronic component without using double-sided adhesive tape.

14. A method of preparing a thermally conductive electrically insulating material of claim 1, the method comprising:
uniformly mixing the 4 to 40 parts by weight of the macromolecular matrix material uncured and the 1 to 20 parts by weight of the adhesive additive;
uniformly adding the 40 to 85 parts by weight of thermally conductive electrically insulating particles to the mixed macromolecular matrix material and adhesive additive; and
curing and shaping the mixture of the macromolecular matrix material and the adhesive additive added with the thermally conductive electrically insulating particles.

15. The method of claim 14, wherein:
the macromolecular matrix material comprises one or more of vinyl silicon resin, polyisobutylene polymer, organic silicon rubber, polyurethane, methyl methacrylate, organopolysiloxane, acrylate, and polyamide resin; and
the adhesive additive comprises one or more of MQ silicon resin, petroleum-based rosin resin, silicone resin, polyol, ethyl acrylate, rosin, and ethylene phenyl acetate resin.

16. The method of claim 14, wherein the thermally conductive electrically insulating particles comprise one or more of aluminum oxide, boron nitride, aluminum nitride, magnesium oxide, and zinc oxide.

17. The method of claim 14, further comprising:
coating a support film with the mixture of the macromolecular matrix material and the adhesive additive added with the thermally conductive electrically insulating particles; and
curing and shaping the mixture coated on the support film.

18. The method of claim 14, wherein the support film comprises glass fiber cloth, polyethylene naphthalate, or polyimide.

19. The method of claim 14, wherein:
both sides of the thermally conductive electrically insulating material have adhesive properties; and
the method further comprises adhering the thermally conductive electrically insulating material between a heat sink and an electronic component without using double-sided adhesive tape.

* * * * *